(12) United States Patent
Feng et al.

(10) Patent No.: US 9,281,209 B1
(45) Date of Patent: Mar. 8, 2016

(54) METHOD FOR FABRICATING SEMICONDUCTOR DEVICE

(71) Applicant: UNITED MICROELECTRONICS CORP., Hsin-Chu (TW)

(72) Inventors: Li-Wei Feng, Kaohsiung (TW); Ssu-I Fu, Kaohsiung (TW); Shih-Hung Tsai, Tainan (TW); Yu-Hsiang Hung, Tainan (TW); Jyh-Shyang Jenq, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/507,840

(22) Filed: Oct. 7, 2014

(30) Foreign Application Priority Data

Aug. 27, 2014 (TW) .............................. 103129583 A

(51) Int. Cl.
*G03F 7/26* (2006.01)
*H01L 21/308* (2006.01)

(52) U.S. Cl.
CPC ........ *H01L 21/3086* (2013.01); *H01L 21/3081* (2013.01)

(58) Field of Classification Search
None
See application file for complete search history.

(56) References Cited

U.S. PATENT DOCUMENTS

| | | | | |
|---|---|---|---|---|
| 5,328,810 A * | 7/1994 | Lowrey | ............... | H01L 21/0271 148/DIG. 106 |
| 7,550,391 B2 * | 6/2009 | Jeon | .................... | H01L 21/0337 257/E21.023 |
| 9,123,659 B1 * | 9/2015 | Fu | ....................... | H01L 21/3086 |
| 9,142,641 B1 * | 9/2015 | Lin | ...................... | H01L 29/6656 |
| 2006/0172540 A1 * | 8/2006 | Marks | ................. | H01L 21/0273 438/700 |
| 2006/0273456 A1 * | 12/2006 | Sant | .................... | H01L 21/3086 257/734 |
| 2007/0020565 A1 * | 1/2007 | Koh | ....................... | G03F 7/0035 430/313 |
| 2008/0008969 A1 * | 1/2008 | Zhou | ................... | H01L 21/0337 430/313 |
| 2008/0057692 A1 * | 3/2008 | Wells | .................. | H01L 21/0337 438/597 |
| 2008/0246168 A1 * | 10/2008 | Kito | .................... | H01L 21/3086 257/786 |
| 2009/0317978 A1 * | 12/2009 | Higashi | ............... | H01L 21/0337 438/703 |
| 2011/0129991 A1 * | 6/2011 | Armstrong | .......... | H01L 21/0273 438/585 |
| 2012/0003809 A1 * | 1/2012 | Kim | .................. | H01L 21/76229 438/421 |
| 2013/0277759 A1 * | 10/2013 | Chen | ............... | H01L 21/823431 257/397 |
| 2014/0248773 A1 * | 9/2014 | Tsai | ....................... | H01L 21/306 438/689 |
| 2015/0014808 A1 * | 1/2015 | Tsai | .................. | H01L 21/76224 257/506 |

OTHER PUBLICATIONS

Chieh-Te Chen, Title of Invention: Patterning Method, U.S. Appl. No. 14/070,262, filed Nov. 1, 2013.

* cited by examiner

*Primary Examiner* — Michael Lebentritt
*Assistant Examiner* — Jordan Klein
(74) *Attorney, Agent, or Firm* — Winston Hsu; Scott Margo

(57) ABSTRACT

A method for fabricating semiconductor device is disclosed. The method includes the steps of: providing a substrate; forming a material layer on the substrate; forming a patterned first hard mask on the material layer; forming a patterned second hard mask on the material; utilizing the patterned first hard mask and the patterned second hard mask to remove part of the material layer for forming sacrificial mandrels; forming sidewall spacers adjacent to the sacrificial mandrels; removing the sacrificial mandrels; and using the sidewall spacers to remove part of the substrate.

7 Claims, 8 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method of utilizing sidewall image transfer (SIT) technique for fabricating fin-shaped structures.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

It is therefore an objective of the present invention to provide a method of fabricating semiconductor device for resolving aforementioned issues caused by conventional art during the fabrication of fin-shaped structures. The method includes the steps of: providing a substrate; forming a material layer on the substrate; forming a patterned first hard mask on the material layer; forming a patterned second hard mask on the material; utilizing the patterned first hard mask and the patterned second hard mask to remove part of the material layer for forming sacrificial mandrels; forming sidewall spacers adjacent to the sacrificial mandrels; removing the sacrificial mandrels; and using the sidewall spacers to remove part of the substrate.

According to another aspect of the present invention, a method for fabricating semiconductor device includes the steps of: providing a substrate; forming a material layer on the substrate; patterning the material layer to form a patterned material layer; covering a first hard mask on the patterned material layer; removing part of the first hard mask and part of the patterned material layer; removing the remaining first hard mask for forming sacrificial mandrels; forming sidewall spacers adjacent to the sacrificial mandrels; removing the sacrificial mandrels; and using the sidewall spacers to remove part of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
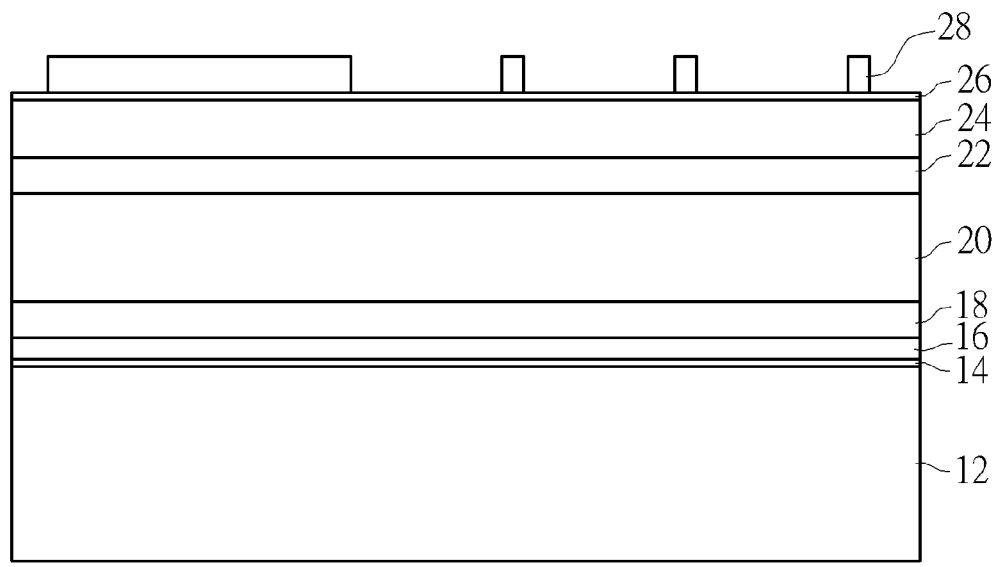
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. As shown in FIG. 1, a substrate 12, such as silicon substrate is provided, and a pad oxide layer 14, a pad nitride layer 16, and an oxide layer 18 are formed sequentially on the substrate 12. A material layer 20 is then formed on the oxide layer 18, a hard mask 22 is formed on the material layer 20, an organic dielectric layer (ODL) 24 is formed on the hard mask 22, and a silicon-containing hard mask bottom anti-reflective coating (SHB) layer 26 is formed on the ODL 24. In this embodiment, the material layer 20 is preferably composed of amorphous silicon, the hard mask 22 is composed of silicon nitride, but not limited thereto.

Figure 2:
Figure 2:
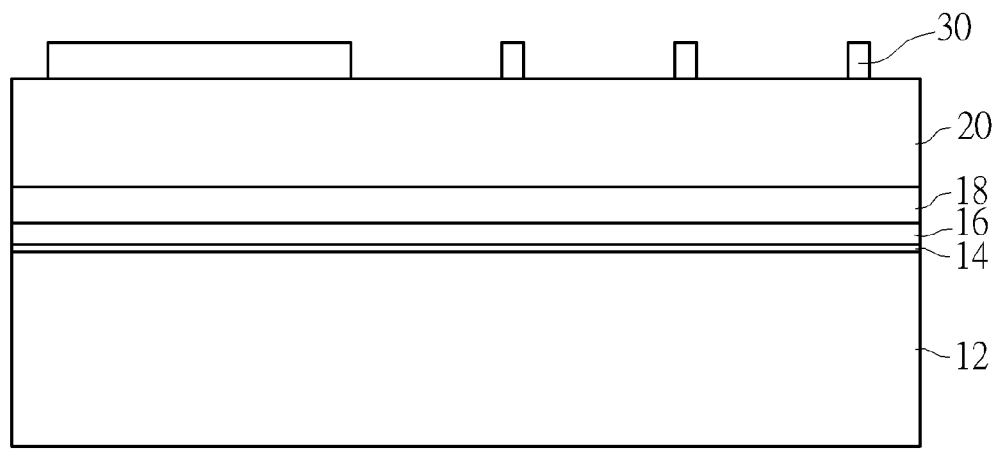

Next, a photo-etching process is conducted by first forming a patterned resist 28 on the SHB layer 26, and as shown in FIG. 2, an etching process is conducted by using the patterned resist 28 as mask to remove part of the SHB layer 26, ODL 24, and hard mask 22 to form a patterned SHB layer (not shown), a patterned ODL (not shown), and a patterned hard mask 30. The patterned resist 28, patterned SHB layer, and patterned ODL are then removed so that only the patterned hard mask 30 is remained on the material layer 20. It should be noted that at this stage of the fabrication, a region could be pre-defined to be used for fabricating device thereafter. For instance, a region 32 could be defined to be used for fabricating high-voltage devices while the region 34 could be used for fabricating metal gate transistors in the later process, in which the hard mask in the region 32 is substantially larger than the hard mask in the other region. In the region 34, the smallest pitch between any two adjacent patterned hard mask 30 is preferably around 128 nm.

Figure 3:
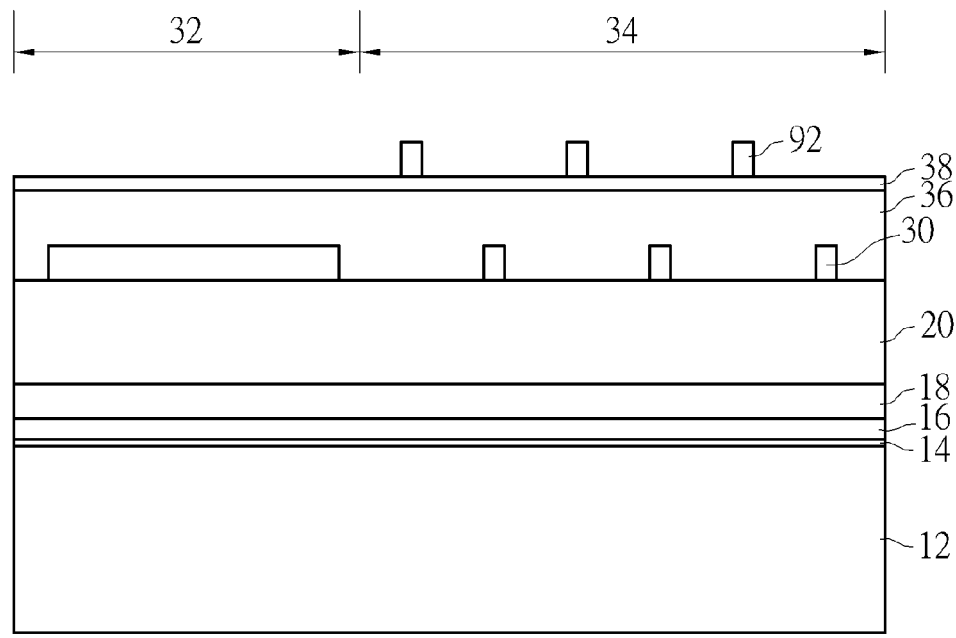

Next, as shown in FIG. 3, another hard mask 36 is formed on the patterned hard mask 30, and another SHB layer 38 is formed on the hard mask 36. In this embodiment, the hard mask 36 is preferably another ODL, but not limited thereto.

Figure 4:
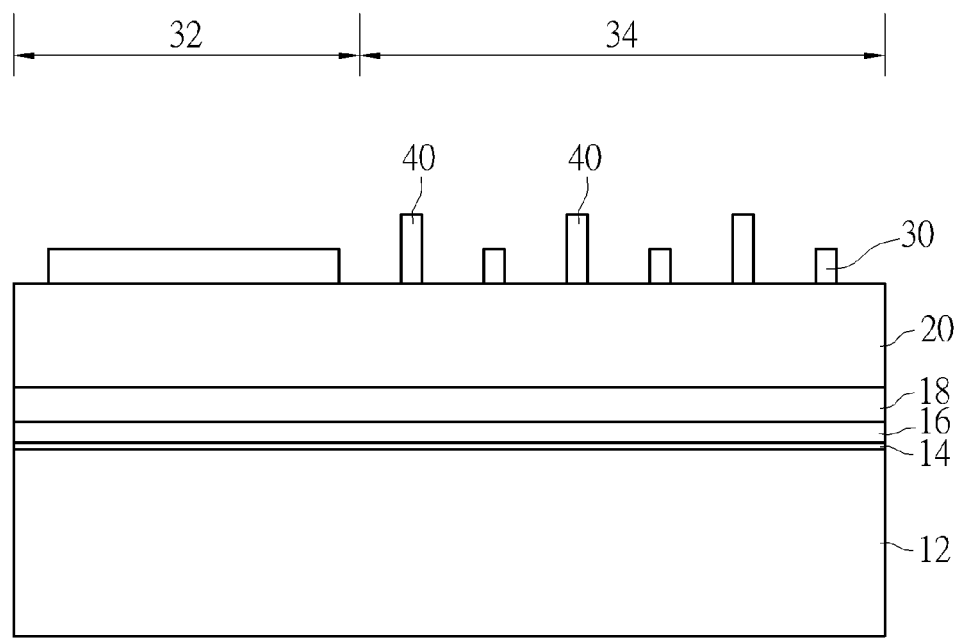

Next, as shown in FIGS. 3-4, another photo-etching process is conducted by using another patterned resist 92 as mask to remove part of the SHB layer 38 and hard mask 36 for forming a patterned SHB layer (not shown) and patterned hard mask 40. The patterned resist and patterned SHB layer are then removed so that only the patterned hard mask 40 is remained on the substrate 12. At this stage, the smallest pitch between any one hard mask from the patterned hard mask 40 to another hard mask is approximately 128 nm and each patterned hard mask 30 and patterned hard mask 40 are preferably disposed alternately.

Figure 5:
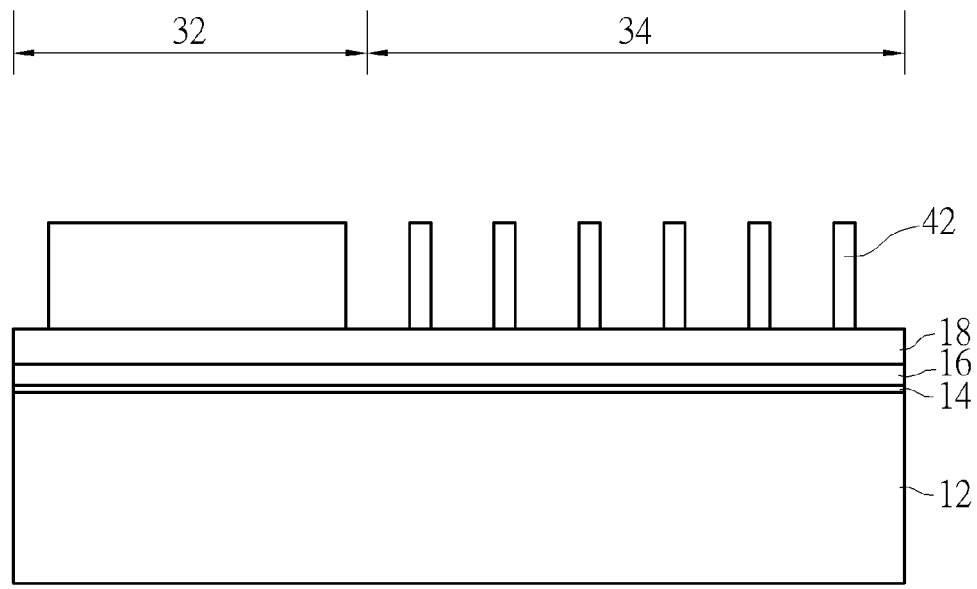

Next, as shown in FIG. 5, an etching process is conducted by using the patterned hard mask 30 and patterned hard mask 40 as mask to remove part of the material layer 20 for forming a plurality of sacrificial mandrels 42. At this stage, the smallest pitch between the sacrificial mandrels 42 is approximately 64 nm.

Figure 6:
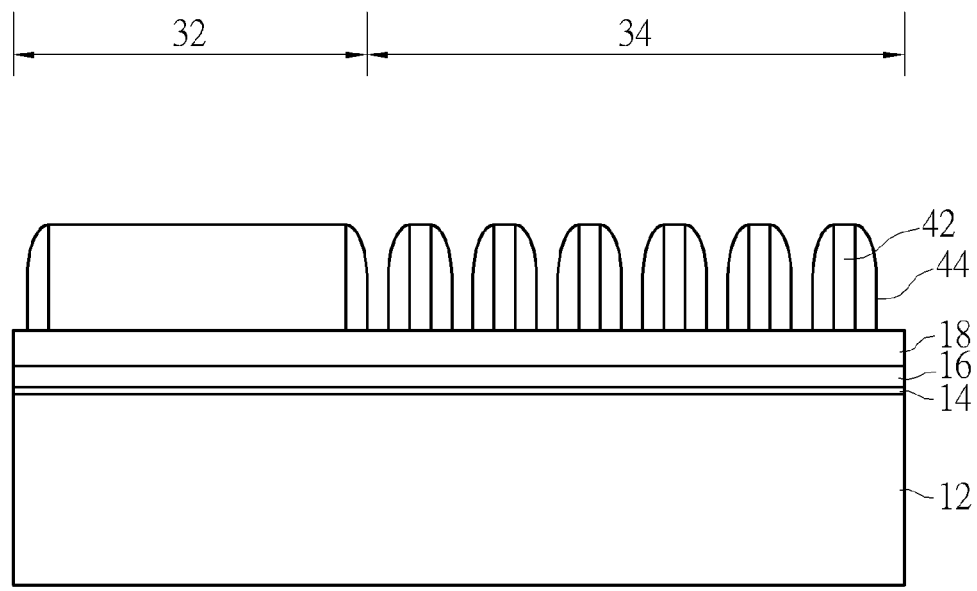

Next, as shown in FIG. 6, a cap layer (not shown) is formed on the oxide layer 18 and sacrificial mandrels 42, and an etching back process is carried out to form a plurality of spacers 44 adjacent to the sidewalls of the sacrificial mandrel 42.

Figure 7:
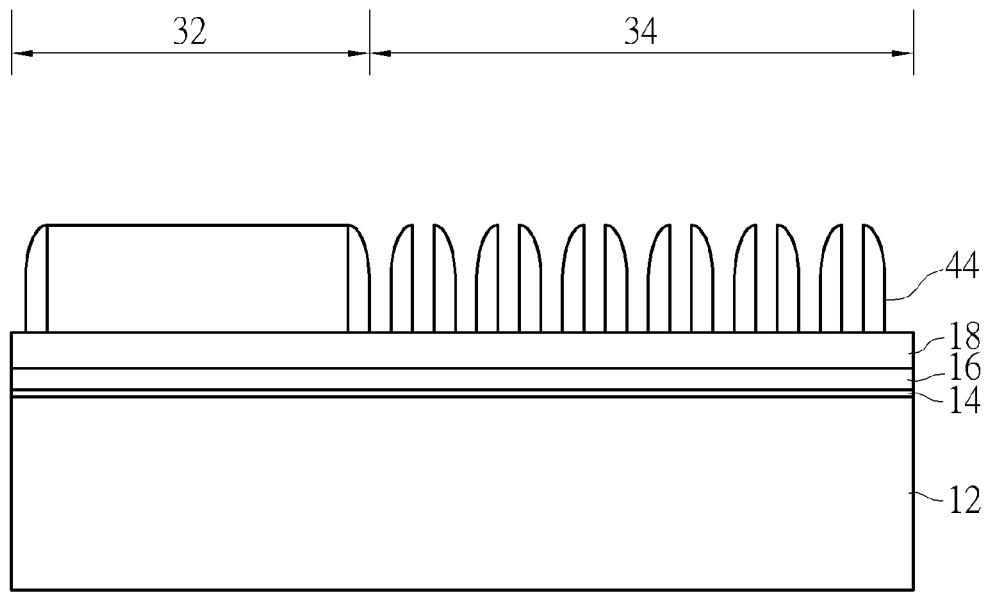

Next, as shown in FIG. 7, a patterned resist (not shown) is formed to cover the sacrificial mandrels 42 and spacers 44 on the region 32, and an etching process is conducted to remove sacrificial mandrels 42 on the region 34 or other sacrificial mandrels 42 not covered by the patterned resist.

Figure 8:
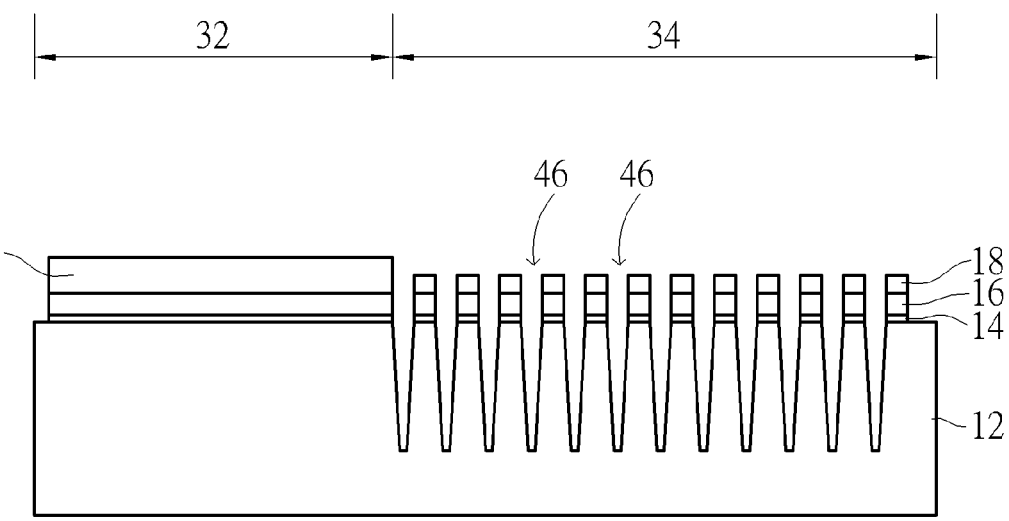

As shown in FIG. 8, an etching process is carried out by using the sacrificial mandrels 42 on the region 32 and spacer 44 as mask to remove part of the oxide layer 18, part of the pad nitride layer 16, part of the pad oxide layer 14, and part of the substrate through single or multiple etching processes. For instance, an etching could be conducted by using each spacer 44 as mask to remove part of the oxide layer 18 and part of the pad nitride layer 16, and then using the patterned oxide layer 18 and patterned nitride layer 16 as mask to remove the sacrificial mandrels 42 and part of the substrate 12 for forming a plurality of openings 46 and defining a plurality fin-shaped structures. Next, a pad layer could be formed on the surface of the openings 46 through atomic layer deposition (ALD) or in-situ steam generation (ISSG) and insulating material could be deposited into the openings 46 thereafter to form shallow trench isolations (STIs). This completes the fabrication of a semiconductor device according to a preferred embodiment of the present invention. Preferably, the region 32 is used for fabricating planar devices such as high-voltage devices thereafter while the region 34 with fin-shaped structures is used for fabricating non-planar devices such as metal gate transistors.

Figure 9:
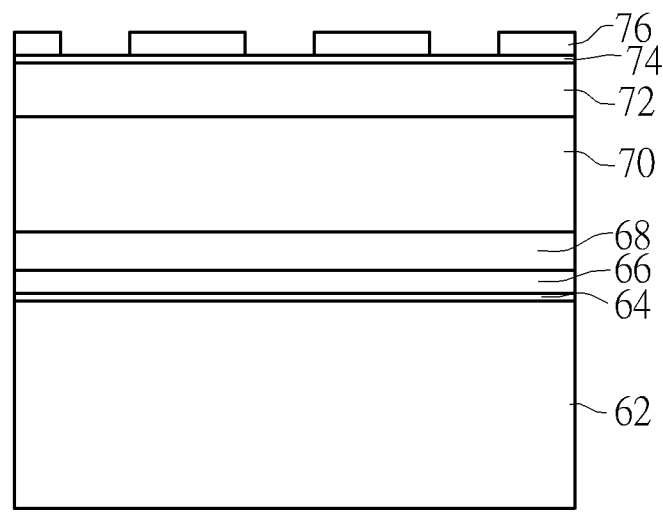
FIGS. 9-15 illustrate a method for fabricating semiconductor device according to another embodiment of the present invention.

Referring to FIGS. 9-15, FIGS. 9-15 illustrate a method for fabricating semiconductor device according to another embodiment of the present invention. As shown in FIG. 9, a substrate 62, such as silicon substrate is provided, and a pad oxide layer 64, a pad nitride layer 66, and an oxide layer 68 are formed sequentially on the substrate 62. A material layer 70 is then formed on the oxide layer 68, a hard mask 72 is formed on the material layer 70, and a silicon-containing hard mask bottom anti-reflective coating (SHB) layer 74 is formed on the hard mask 72. In this embodiment, the material layer 70 is preferably composed of amorphous silicon, the hard mask 72 is composed of an organic dielectric layer (ODL), but not limited thereto.

Figure 10:
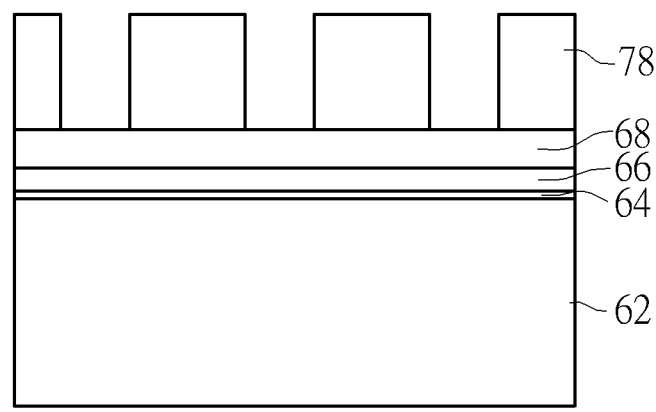

Next, a photo-etching process is conducted by first forming a patterned resist 76 on the SHB layer 74, and as shown in FIG. 10, an etching process is conducted by using the patterned resist 76 as mask to remove part of the SHB layer 74, hard mask 72, and material layer 70 to form a patterned SHB layer (not shown), a patterned hard mask (not shown), and a patterned material layer 78. The patterned resist, patterned SHB layer, and patterned hard mask are then removed so that only the patterned material layer 78 is remained on the oxide layer 68. At this stage, the smallest pitch between one material layer to another material layer from the patterned material layer 78 is preferably around 128 nm.

Figure 11:
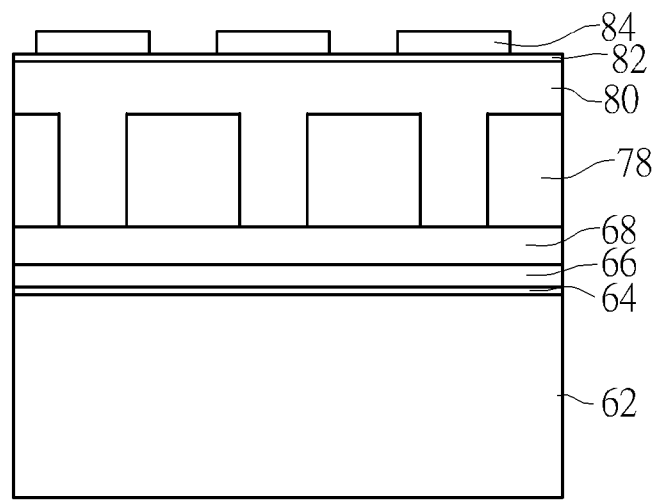
Figure 12:
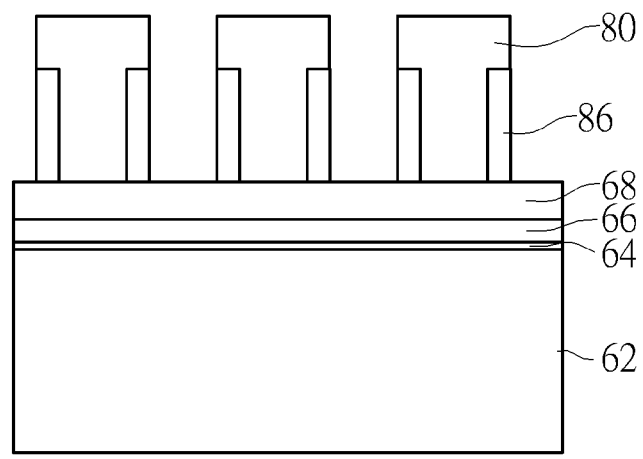

Next, as shown in FIG. 11, another hard mask 80 is formed on the patterned material layer 78 and oxide layer 68, and another SHB layer 82 is formed on the hard mask 80. In this embodiment, the hard mask 80 could include an ODL like the hard mask 72, but not limited thereto. Next, another photo-etching process is conducted by first forming a patterned resist 84 on the SHB layer 82, and as shown in FIG. 12, an etching process is conducted by using the patterned resist 84 as mask to remove part of the SHB layer 82, part of the hard mask 80, and part of the patterned material layer 78. After removing the remaining SHB layer 82, a plurality of sacrificial mandrels 86 is defined. It should be noted at this stage, the smallest pitch between any two adjacent patterned resist 84 is approximately 128 nm, and as each patterned resist 84 covers two patterned material layers 78 underneath, the smallest pitch between one of the material layer to another material layer under the patterned hard mask 80 after the etching process disclosed in FIG. 12 would be approximately 128 nm.

Figure 13:
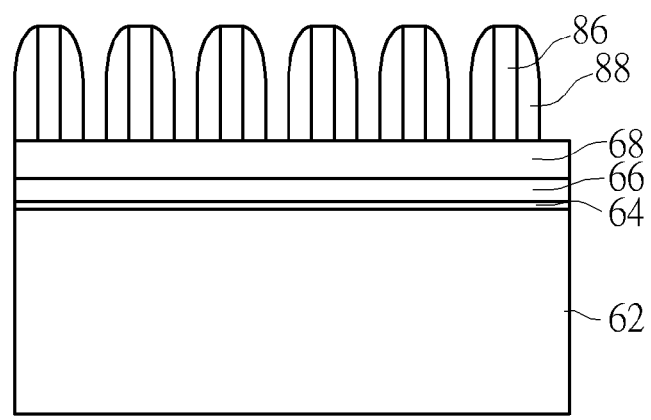

Next, as shown in FIG. 13, the remaining hard mask 80 is removed to expose the sacrificial mandrels 86, in which the smallest pitch at this stage between any two adjacent sacrificial mandrels 86 is approximately 64 nm. A spacer formation is performed thereafter by first forming a cap layer (not shown) on the oxide layer 68 and sacrificial mandrels 86, and then an etching back process is conducted to form a plurality of spacers 88 adjacent to the sidewalls of the sacrificial mandrels 86. The smallest pitch at this stage between any two adjacent spacers 88 is approximately 32 nm.

Figure 14:
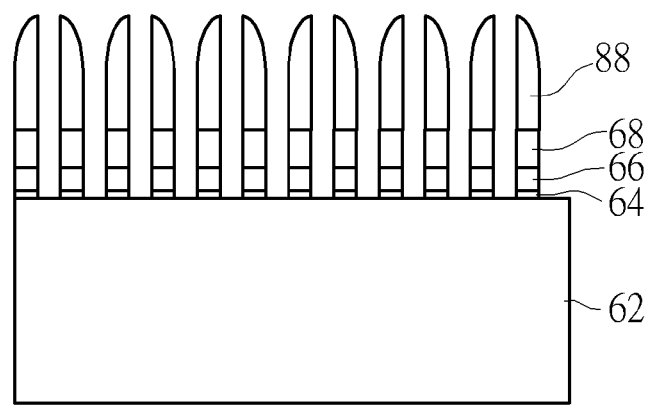

Next, as shown in FIG. 14, an etching process is conducted to remove all of the sacrificial mandrels 86 for exposing the oxide layer 68, and another etching, preferably a single or multiple etching process, is carried out by using the spacer 88 as mask to remove part of the oxide layer 68, part of the pad nitride layer 66, and part of the pad oxide layer 64 to expose the surface of the substrate 62.

Figure 15:
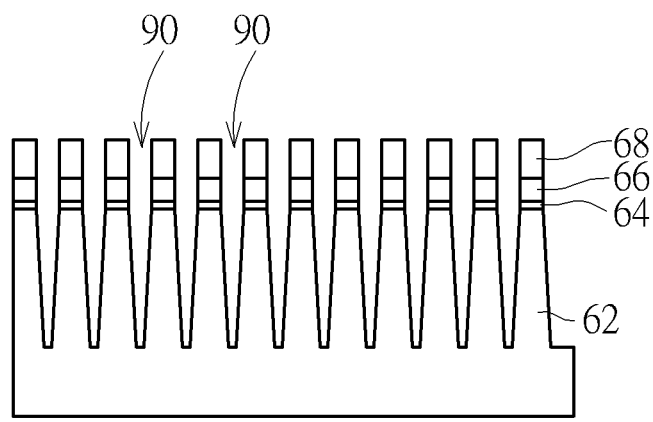

Next, as shown in FIG. 15, further etchings are conducted by using the spacer 88 as mask to remove part of the substrate 62 for forming a plurality of openings 90 and defining a plurality of fin-shaped structures. After removing the spacers, insulating material could be deposited into the openings 90 to form shallow trench isolations (STIs) depending on the demand of the product. This completes the fabrication of a semiconductor device according to an embodiment of the present invention.

Overall, the present invention discloses an improved sidewall image transfer process, which preferably utilizes multiple photo-etching processes to transfer the desired pattern pitch to sacrificial mandrels, and then using the sacrificial mandrels to form spacers with even smaller pitches. Ultimately fin-shaped structures with desirable pitch could be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a material layer on the substrate;
   forming a first hard mask on the material layer;
   forming a first organic dielectric layer (ODL) on the first hard mask;
   forming a first silicon-containing hard mask bottom anti-reflective coating (SHB) layer on the first ODL;
   patterning the first SHB layer, the first ODL, and the first hard mask for forming a patterned first SHB layer, a patterned first ODL, and a patterned first hard mask;
   removing the patterned first SHB layer and the patterned first ODL for forming the patterned first hard mask on the material layer;
   forming a patterned second hard mask on the material layer;
   utilizing the patterned first hard mask and the patterned second hard mask to remove part of the material layer for forming sacrificial mandrels;

forming sidewall spacers adjacent to the sacrificial mandrels;

removing the sacrificial mandrels; and using the sidewall spacers to remove part of the substrate.

2. The method of claim 1, wherein the material layer comprises amorphous silicon.

3. The method of claim 1, further comprising:

forming a second hard mask on the patterned first hard mask;

forming a second SHB layer on the second hard mask;

patterning the second SHB layer and the second hard mask for forming a patterned second SHB layer and the patterned second hard mask; and removing the patterned second SHB layer.

4. The method of claim 3, wherein the patterned second hard mask comprises a second ODL.

5. The method of claim 1, wherein the patterned first hard mask comprises silicon nitride.

6. The method of claim 1, further comprising forming a pad oxide layer, a pad nitride layer, and an oxide layer on the substrate before forming the material layer.

7. The method of claim 6, further comprising utilizing the sidewall spacers to remove part of the oxide layer, part of the pad nitride layer, and part of the pad oxide layer before removing part of the substrate.

* * * * *